United States Patent
Ke et al.

(10) Patent No.: US 12,324,301 B2
(45) Date of Patent: Jun. 3, 2025

(54) CONTAMINATED INTERFACE MITIGATION IN A SEMICONDUCTOR DEVICE

(71) Applicant: Imec vzw, Leuven (BE)

(72) Inventors: Tung Huei Ke, Leuven (BE); David Cheyns, Heffen (BE); Pawel Malinowski, Heverlee (BE)

(73) Assignee: IMEC VZW, Leuven (BE)

( * ) Notice: Subject to any disclaimer, the term of this patent is extended or adjusted under 35 U.S.C. 154(b) by 460 days.

(21) Appl. No.: 17/502,708

(22) Filed: Oct. 15, 2021

(65) Prior Publication Data
US 2022/0140276 A1   May 5, 2022

(30) Foreign Application Priority Data
Oct. 29, 2020   (EP) .................................... 20204665

(51) Int. Cl.
*H10K 50/15*   (2023.01)
*G03F 7/20*   (2006.01)
(Continued)

(52) U.S. Cl.
CPC .......... *H10K 50/156* (2023.02); *H10K 50/16* (2023.02); *H10K 50/81* (2023.02); *H10K 50/82* (2023.02);
(Continued)

(58) Field of Classification Search
CPC .... H10K 50/156; H10K 50/16; H10K 85/615; H10K 85/624; H10K 85/626;
(Continued)

(56) References Cited

U.S. PATENT DOCUMENTS

| 6,506,616 B1 | 1/2003 | Kim et al. |
| 2007/0108894 A1 | 5/2007 | Hosokawa et al. |

(Continued)

FOREIGN PATENT DOCUMENTS

| EP | 3266848 A1 | 1/2018 |
| EP | 3301093 A1 | 4/2018 |

OTHER PUBLICATIONS

IP.com npl search (Year: 2024).*
(Continued)

*Primary Examiner* — Shaun M Campbell
*Assistant Examiner* — David Paul Sedorook
(74) *Attorney, Agent, or Firm* — McDonnell Boehnen Hulbert & Berghoff LLP

(57) ABSTRACT

A semiconductor device comprises a substrate, a first hole-transporting layer over the substrate, a first electron-transporting layer on the first hole-transporting layer, and a second hole-transporting layer over the first electron-transporting layer. At least one of the first electron-transporting layer and the second hole-transporting layer has an organic component. The device is characterized by one of the following: a metal oxide layer present on the first electron-transporting layer, wherein a second electron-transporting layer is on the metal oxide layer, wherein the second hole-transporting layer is on the second electron-transporting layer, or the second hole transporting layer has a first p-doped hole-transporting surface present on the first electron-transporting, layer and a second p-doped hole-transporting surface facing away from the first p-doped hole-transporting surface, or the first electron-transporting layer is on a top surface and on sidewalls of the first hole-transporting layer.

8 Claims, 12 Drawing Sheets

(51) Int. Cl.
  *H10K 50/16* (2023.01)
  *H10K 50/81* (2023.01)
  *H10K 50/82* (2023.01)
  *H10K 71/00* (2023.01)
  *H10K 85/60* (2023.01)

(52) U.S. Cl.
  CPC ........... *H10K 71/00* (2023.02); *G03F 7/2022* (2013.01); *H10K 85/615* (2023.02); *H10K 85/624* (2023.02); *H10K 85/626* (2023.02); *H10K 85/633* (2023.02); *H10K 85/6572* (2023.02)

(58) Field of Classification Search
  CPC .......................... H10K 85/633; H10K 85/6572; G03F 7/2022; H01L 51/5084; H01L 51/5072; H01L 51/5206; H01L 51/5221; H01L 51/56; H01L 51/0052; H01L 51/0056; H01L 51/0058; H01L 51/006; H01L 51/0072
  See application file for complete search history.

(56) References Cited

U.S. PATENT DOCUMENTS

| | | | |
|---|---|---|---|
| 2014/0203251 A1* | 7/2014 | Jung | H10K 85/655 |
| | | | 548/440 |
| 2014/0291647 A1* | 10/2014 | Suzuki | H10K 50/11 |
| | | | 257/40 |
| 2016/0204388 A1* | 7/2016 | Höfle | H10K 50/19 |
| | | | 257/40 |
| 2017/0155071 A1* | 6/2017 | Han | H10K 50/19 |
| 2018/0097184 A1 | 4/2018 | Lee et al. | |
| 2018/0118742 A1 | 5/2018 | Joo et al. | |
| 2019/0044086 A1* | 2/2019 | Xia | H10K 50/156 |
| 2019/0181354 A1 | 6/2019 | Shin et al. | |
| 2020/0199090 A1 | 6/2020 | Jang et al. | |

OTHER PUBLICATIONS

Extended European Search Report and Written Opinion, Application No. EP20204665.2, mailed Apr. 21, 2021, 8 pages.
Jeon et al., "Driving Voltage Reduction by Multiple Charge Generation and Recombination in Organic Light-Emitting Diode", IMID Digest, 2011, pp. 1-2.

* cited by examiner

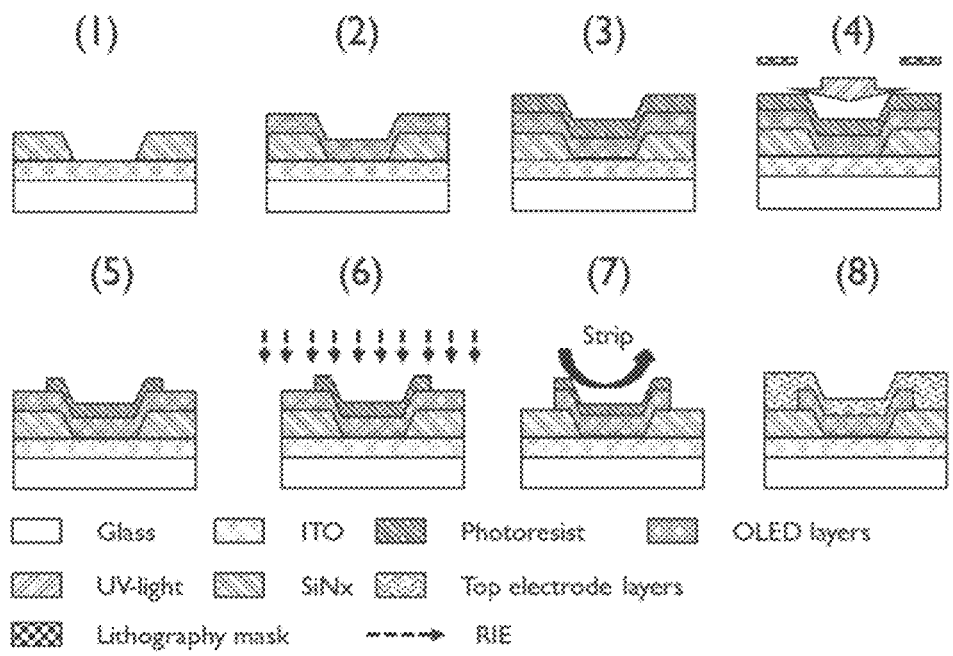
FIG. 1
(PRIOR ART)
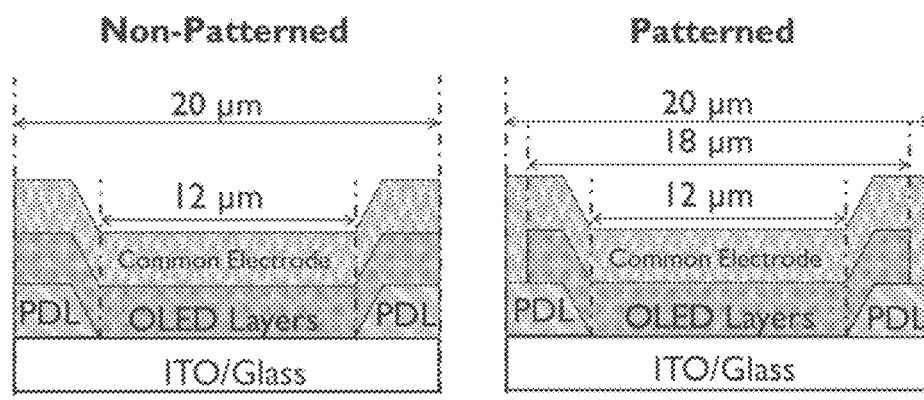
FIG. 2A
(PRIOR ART)
FIG. 2B
(PRIOR ART)

| 150 nm Ag |
|---|
| 10 nm NPB with 5% doping F6TCNNQ |
| 30 nm NPB |
| 20 nm HATCN |
| 100nm HTL:NPB |
| 10 nm HIL:NPB:F6TCNNQ 5% -10nm |
| ITO + SiN |
| Glass |

FIG. 5
(PRIOR ART)

| 150 nm Ag |
| --- |
| 10 nm NPB with 5% doping F6TCNNQ |
| 30 nm NPB |
| 10 nm Doped Spiro-TAD:F6TCNNQ 5% |
| 10 nm Doped Spiro-TAD:F6TCNNQ 5% |
| 20 nm HATCN |
| 100nm HTL:NPB |
| 10nm HIL:NPB:F6TCNNQ 5% |
| ITO + SiN |
| Glass |

FIG. 8

CONTAMINATED INTERFACE MITIGATION IN A SEMICONDUCTOR DEVICE

CROSS-REFERENCE TO RELATED APPLICATIONS

The present application is a non-provisional patent application claiming priority to European Patent Application No. 20204665.2, filed Oct. 29, 2020, the contents of which are hereby incorporated by reference.

FIELD OF THE DISCLOSURE

This application relates to the field of semiconductor devices and more in particular to the manufacture of semiconductor devices comprising an organic component.

BACKGROUND

Devices comprising one or more organic semiconductor layers, such as organic light-emitting diodes (OLEDs), organic photodetectors (OPDs), perovskite LEDs, quantum dot light emitting diodes (QDLEDs), etc., are very sensitive to contamination, Contaminants such as water, oxygen, and organic compounds, easily deteriorate the properties and the reliability of these devices.

One important example of device degradation due to a contaminant is the degradation of device characteristics (e.g., OLED device characteristics) by a photolithography process step. An example of such a process is shown in FIG. 4 where the fabrication of a device integrating two OLEDs of different colors is depicted. In that process, after the deposition of a first semiconductor layer stack responsible for the first color, as shown, in FIG.(i), a photoresist is deposited thereon and patterned, as shown in FIG.(ii). This pattern is then transferred to the first semiconductor stack, as shown in FIG.(iii). A second semiconductor stack responsible for the second color is then deposited, as shown in FIG.(iv). A patterned photoresist is formed on the $2^{nd}$ deposited semiconductor stack, as shown in FIG.(v). This pattern is then transferred in the second semiconductor stack responsible for the second color, as shown in FIG.(vi). After the removal of the photoresist, the device having two OLEDs of different colors is produced. Features introduced by such steps (e.g., the OLED's smallest lateral dimension after patterning) typically measure from 20 µm to 100 nm. Referring to FIG. 1, more generally, such processes typically comprise the steps of: (1) providing a substrate, (2) depositing on the substrate an organic semiconductor layer or a stack of layers comprising at least one organic semiconductor layer by via vacuum evaporation or solution processing; (3) providing a photoresist layer by methods known in the state of the art; (4) illuminating pattern-wise the photoresist with an appropriate electromagnetic radiation spectrum and dose; (5) developing the photoresist with an appropriate developer; (6) etching the layer(s); and (7) stripping the photoresist. At the end, a patterned layer(s) remains. To form a device from the pattered layer(s), typically more layers are deposited, such as one or more semiconductor layers and a metal layer (8), However, such a process introduces impurities during the stripping step (7). After stripping the photoresist layer, a layer of residue typically remains on the patterned layer(s). As a result, the electrical characteristics of the patterned device (e.g., FIG. 2A) are worse than those of a corresponding un-patterned device (e.g., FIG. 2B).

FIG. 3 shows the I-V characteristics of OLEDs in structures of FIG. 2 which are un-patterned and patterned, After patterning, a higher voltage becomes necessary to reach a particular current density. Also, the un-patterned device of FIG. 2A displays 86.0 cd/A at a luminance of 1000 nit for an operating voltage of 5.4 V while the patterned device of FIG. 2B displays only 71.4 cd/A at a luminance of 1000 nit for an operating voltage of 10.5 V. These worse performances of the patterned device are due to residues left, after photoresist stripping, on the top surface of the patterned stack or layer. Without being bound by theory, it is believed that such residues increase charge trapping and/or perturb charge hopping in the layer contacting the contaminant. These residues are one example of contaminants but other sorts of contaminations relevant to organic optoelectronic devices exist. In general, when the top organic semiconductor layer has been in contact with another material (be it solid, liquid or gas), a thin layer may be adsorbed, either physisorbed or chemisorbed, on its surface or reacted therewith. All these possible changes to the top surface of the pristine semiconductor are contaminations that the present disclosure addresses.

SUMMARY

A first aspect relates to a process for manufacturing a semiconductor device, comprising the steps of:
  forming a first hole-transporting layer over a substrate,
  forming a first electron-transporting layer on the first hole-transporting layer, and
  forming a second hole-transporting layer over the first electron-transporting layer.

At least one of the first electron-transporting layer and the second hole-transporting layer has an organic component.

The process is further characterized by one of the following:
  forming a metal oxide layer on the first electron-transporting layer and forming a second electron-transporting layer on the metal oxide layer, wherein the second hole-transporting layer is on the second electron-transporting layer, or
  the second hole transporting layer has a first p-doped hole-transporting surface present on the first electron-transporting layer and a second p-doped hole-transporting surface facing away from the first p-doped hole-transporting surface, or
  performing a photolithographic patterning step during forming of the first electron transporting layer wherein forming of the first electron transporting layer comprises forming a first part of the first electron transporting layer and forming a second part of the first electron transporting layer, and wherein the photolithographic patterning is performed on the layer provided during the forming of the first part of the first electron transporting layer.

A second aspect relates to a semiconductor device comprising:
  a substrate,
  a first hole-transporting layer over the substrate,
  a first electron-transporting layer on the first hole-transporting layer, and
  a second hole-transporting layer over the first electron-transporting layer.

At least one of the first electron-transporting layer and the second hole-transporting layer has an organic component.

The device is further characterized by one of the following:
  a metal oxide layer present on the first electron-transporting layer, wherein a second electron-transporting layer is on the metal oxide layer, wherein the second hole-transporting layer is on the second electron-transporting layer, or the second hole transporting layer has a first p-doped hole-transporting surface present on the first electron-transporting layer and a second p-doped hole-transporting surface facing away from the first p-doped hole-transporting surface, or the first electron-transporting layer is on a top surface and on sidewalls of the first hole-transporting layer.

These aspects mitigate the presence of impurities in semiconductor devices without having to actually remove the impurities.

BRIEF DESCRIPTION OF THE FIGURES

The above, as well as additional, features will be better understood through the following illustrative and non-limiting detailed description of example embodiments, with reference to the appended drawings.

FIG. 1 is a schematic representation, of a process for forming an OLED.

FIG. 2A shows a schematic representation of a cross-section of an OLED which is not patterned.

FIG. 2B shows a schematic representation of a cross-section of an OLED which is patterned.

FIG. 5 is a schematical representation of a cross-section of a comparative device.

FIG. 8 is a schematical representation of a cross-section of a device, in accordance with example embodiments.

Figure 3:
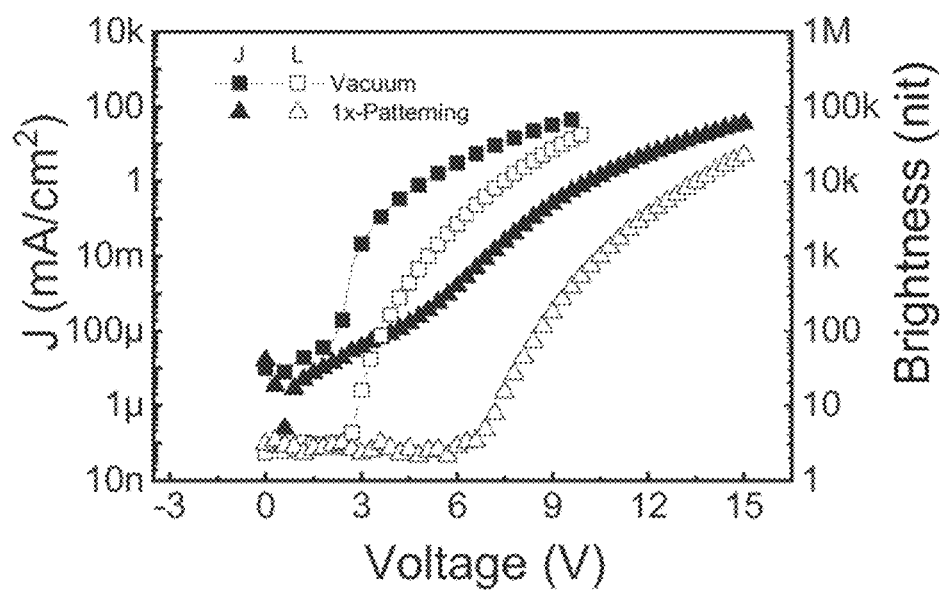
FIG. 3 shows the J-V characteristics of OLEDs in structures of FIGS. 2A and 23 which are not patterned or patterned.
Figure 4:
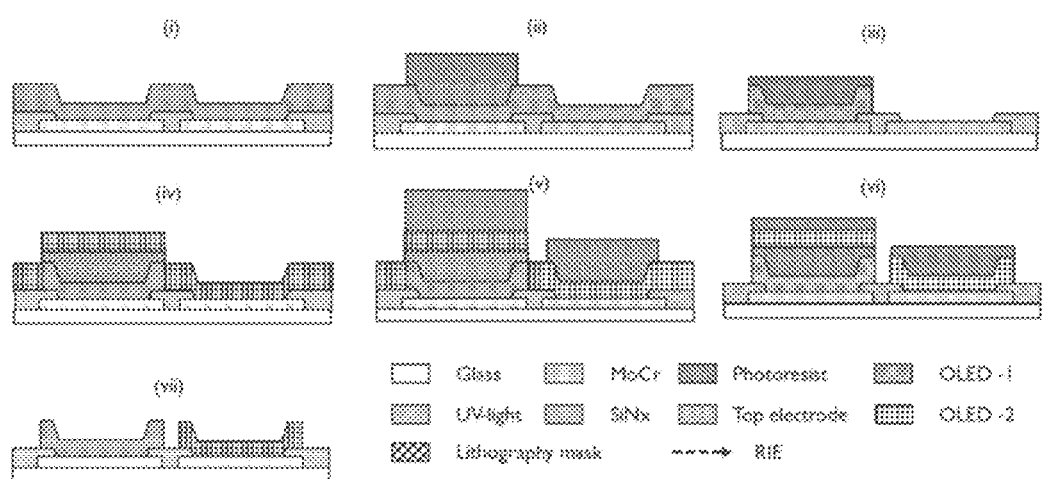
FIG. 4 is a schematic representation of a process for forming an OLED with emission in two different colors.

In the different figures, the same reference signs refer to the same or analogous elements. Further all the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present (and can therefore always be replaced by "consisting of" in order to restrict the scope to said stated features) and the situation where these features and one or more other features are present. The word "comprising" according to the present disclosure therefore also includes as one embodiment that no further components are present. Thus, the scope of the expression "a device comprising means A and B" should not be interpreted as being limited to devices consisting only of components A and B.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent to one of ordinary skill in the an from this disclosure, in one or more embodiments.

Similarly, it should be appreciated that in the description of exemplary embodiments, various features are sometimes grouped together in a single embodiment, figure, or description thereof for the purpose of streamlining the disclosure and aiding in the understanding of one or more of the various aspects. This method of disclosure, however, is not to be interpreted as reflecting an intention that the claims require more features than are expressly recited in each claim. Rather, as the following claims reflect, certain aspects lie in less than all features of a single foregoing disclosed embodiment, Thus, the claims following the detailed description are hereby expressly incorporated into this detailed description, with each claim standing on its own as a separate embodiment of the present disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

A first aspect relates to a process for manufacturing a semiconductor device. In embodiments, the process may be for avoiding or mitigating contamination by a photolithographic patterning step of a charge generation interface between the first electron-transporting layer and the second hole-transporting layer. The semiconductor device comprises at least one layer having an organic component. Examples of such devices are organic light-emitting diodes (OLEDs), organic photodetectors (OPDs) and organic thin-film transistors (OTFTs). An example of the semiconductor device is an optoelectronic device. An example of the semiconductor device is an organic optoelectronic device. Examples of organic optoelectronic devices to which the first aspect may relate are: organic light-emitting diodes (OLEDs), organic photodetectors (OPDs), perovskite LEDs comprising at least a layer having an organic component, and quantum dot light emitting diodes (QDLEDs) comprising at least a layer having an organic component, amongst others. An example of the semiconductor device is a light-emitting device such as an OLED, a perovskite LED comprising at least a layer having an organic component or a QDLED. Illustrated herein will be the manufacture of an OLED.

The process includes forming a first hole-transporting layer over a substrate.

The substrate can be any substrate. The substrate typically comprises a plurality of layers, at least one of which being conductive. For optoelectronic applications, a typical substrate is composed of a transparent bottom substrate (e.g., glass), a transparent conductive layer thereon (e.g., Indium Tin Oxide), and a Pixel Definition Layer (PDL), which is an insulator that defines the contact area between the transparent conductive layer and the organic semiconductor stack present thereon. This PDL can, for instance, be a patterned silicon nitride layer. In embodiments where the semiconductor device is a light-emitting device, the substrate may be transparent to a light emitted by the device.

The first hole-transporting layer may be made of any material known in the art for having holes as a majority charge carrier. An example of the first hole-transporting layer has an organic component. An example of the first hole-transporting layer is an organic layer. The first hole-transporting layer is over the substrate and may be in direct physical contact therewith or separated therefrom by one or more layers. The first hole-transporting layer may be doped or undoped.

In embodiments, the first hole-transporting layer may be composed for at least 80 wt % of a material selected from the list consisting of the following compounds: 2,2′7,7′-Tetrakis (diphenylamino)-9,9′-spirobifluorene (Sprio-TAD), Tris(4-carbazoyl-9-ylphenyl)amine (TCTA), 4,4′-Cyclohexylidenebis[N,N-bis(4-methylphenyl)benzenamine] (TAPC), N,N-bis (naphthalen-1-yl)-N, N-bis (phenyl) benzidine (NPB), and N,N Di(1-naphthyl)-N,N′-diphenyl-(1,1′-biphenyl)-4,4′-diamine (Alpha-NPD), and mixtures thereof.

When doped, the first hole-transporting layer may be composed for at most 20% of a p-type dopant.

When doped, the first hole-transporting layer may, for instance, comprise at most 20% of a material selected from the list consisting of hexafluorotetracyanonaphthoquinodimethane (F6TCNNQ), 2,3,5,6-Tetrafluoro-7,7,8,8-tetracyanoquinodimethane (F4TCNQ), $MoO_3$, and mixtures thereof, amongst others.

The first hole-transporting layer may, for instance, be deposited by vacuum evaporation or by solution processing.

The process includes forming a first electron-transporting layer on (i.e., in direct physical contact with) the first hole-transporting layer.

The first electron-transporting layer may be made of any material known in the art for having electrons as a majority charge carrier. An example of the first electron-transporting layer has an organic component. An example of the first electron-transporting layer is an organic layer. The first electron-transporting layer is in direct physical contact with the first hole-transporting layer. The first electron-transporting layer may be doped or undoped.

In embodiments, the first electron-transporting layer may comprise at least 80 wt % of a material selected from the list consisting of the following compounds: 2′,2″-(1,3,5-Benzenetriyl)-Tris(1-phenyl-1-H-benzimidazole) (TPBI), Bathophenanthroline (BPHEN) 2,9-Dinaphthalen-2-yl-4,7-diphenyl-1,10-phenanthroline (NBPHEN), 1,3,5-Tri(m-pyridin-3-ylphenyl)benzene (TMPYPB), 4,6-Bis(3,5-di (pyridin-3-yl)phenyl)-2-methylpyrimidine (B3PYMPM), and mixtures thereof.

When doped, the first electron-transporting layer may comprise at most 20% of an n-type dopant.

When doped, the first electron-transporting layer may for instance be composed of at most 20% of a material selected from the list consisting of 2-(2-Methoxyphenyl)-1,3-dimethyl-1H-benzoimidazol-3-ium iodide (o-MeO-DMBI-I), 1,3-Dimethyl-2-phenyl-2,3-dihydro-1H-benzoimidazole (DMBI), (pentamethylcyclopentadienyl)(1,3,5-trimethylbenzene)ruthenium dimer ([RuCpMes]$_2$), Li, $Li_2O$, 8-Quinolinolato lithium (LiQ), LiF, $Li_3N$, NaF, Ba, $Rb_2CO_3$, Cs, $CsN_3$, CsF, $CsCo_3$, and mixtures thereof amongst others.

The first hole-transporting layer may, for instance, be deposited by vacuum evaporation or by solution processing.

The process includes forming a second hole-transporting layer over the first electron-transporting layer.

The second hole-transporting layer may be made of any material known in the art for having holes as a majority charge carrier. An example of the second hole-transporting layer has an organic component. An example of the second hole-transporting layer is an organic layer. The second hole-transporting layer is over the substrate and may be in direct physical contact therewith or separated therefrom by one or more layers. The second hole-transporting layer may be doped or undoped.

In embodiments, the second hole-transporting layer may comprise at least 80 wt % of a material selected from the list consisting of the following compounds: 2,2′,7,7′-Tetrakis (diphenylamino)-9,9′-spirobifluorene (Sprio-TAD), Tris(4-carbazoyl-9-ylphenyl)amine (TCTA), 4,4′-Cyclohexylidenebis[N,N-bis(4-methylphenyl)benzenamine] (TAPC), N, N-bis (naphthalen-1-yl)-N, N-bis (phenyl) benzidine (NPB), and N,N Di(1-naphthyl)-N, N′-diphenyl-(1,1′-biphenyl)-4, 4′-diamine (Alpha-NPD), and mixtures thereof.

When doped, the second hole-transporting layer may comprise at most 20%, preferably from 2 to 10%, of a p-type dopant.

When doped, the second hole-transporting layer may for instance comprise at most 20% of a material selected from the list consisting of hexafluorotetracyanonaphthoquinodimethane (F6TCNNQ), 2,3,5,6-Tetrafluoro-7,7,8,8-tetracyanoquinodimethane (F4TCNQ), MoO$_3$, and mixtures thereof, amongst others.

The second hole-transporting layer may, for instance, be deposited by vacuum evaporation or by solution processing.

In embodiments, the first and the second hole-transporting layers may independently comprise at least 80 wt % of a material selected from the list consisting of the following compounds: 2,2',7,7'-Tetrakis(diphenylamino)-9,9-spirobifluorene, Tris(4-carbazoyl-9-ylphenyl)amine, 4,4'-Cyclohexylidenebis[N,N-bis(4-methylphenyl)benzenamine], N,N-bis (naphthalen-1-yl)-N, N-bis (phenyl) benzidine, and N,N-Di(1-naphthyl)-N,N'-diphenyl-(I, 1-biphenyl)-4,4'-diamine, and mixtures thereof.

In embodiments, the first and the second hole-transporting layers, when doped, may independently comprise at most 20 wt % of a material selected from the list consisting of the following compounds: hexafluorotetracyanonaphthoquinodimethane (F6TCNNQ), 2,3,5,6-Tetrafluoro-7,7,8,8-tetracyanoquinodimethane (F4TCNQ), MoO$_3$, and mixtures thereof, amongst others.

At least one of the first electron-transporting layer and the second hole-transporting layer have an organic component. In some examples, at least one of the first electron-transporting layer and the second hole-transporting layer are organic layers. In some examples, both the first electron-transporting layer and the second hole-transporting layer have an organic component. In some examples, both the first electron-transporting layer and the second hole-transporting layer are organic layers. In some examples, the first and second hole-transporting layers as well as the first electron transporting layer have each an organic component. In some examples, the first and second hole-transporting layers as well as the first electron transporting layer are organic layers.

The first aspect mitigates the presence of contaminants by one of the following methods:
  Method A: Forming a metal oxide layer on the first electron-transporting layer and forming a second electron-transporting layer on the metal oxide layer, wherein the second hole-transporting layer is on the second electron-transporting layer, or
  Method B: the second hole transporting layer has a first p-doped hole-transporting surface present on the first electron-transporting layer and a second p-doped hole-transporting surface facing away from the first p-doped hole-transporting surface, or
  Method C: performing a photolithographic patterning step during forming of the first electron transporting layer wherein forming of the first electron transporting layer comprises forming a first part of the first electron transporting layer and forming of a second part of the first electron transporting layer, and wherein the photolithographic patterning step is performed on the layer provided during forming of the first part of the first electron transporting layer.

In method A, the metal oxide layer may be selected from MoO$_3$, RuO$_2$, V$_2$O$_5$, Fe$_3$O$_4$, WO$_3$, NiO, CUO, and Ag$_2$O. In some examples, the metal oxide layer is a MoO$_3$ layer.

The second electron-transporting layer may be made of any material known in the art for having electrons as a majority charge carrier. An example of the second electron-transporting layer has an organic component. An example of the second electron-transporting layer is an organic layer. The second electron-transporting layer is in direct physical contact with the second hole-transporting layer and the metal oxide layer. The second electron-transporting layer may be doped or undoped.

In embodiments, the second electron-transporting layer may comprise at least 80 wt % of a material selected from the list consisting of the following compounds: 2'2"-(1,3,5-Benzenetriyl)-Tris(1-phenyl-1-H-benzimidazole) (TPBI), Bathophenanthroline (BPHEN), 2,9-Dinaphthalen-2-yl-4,7-diphenyl-1,10-phenanthroline (NBPHEN), 1,3,5-Tri(m-pyridin-3-ylphenyl)benzene (TMPYPB), 4,6-Bis(3,5-di(pyridin-3-yl)phenyl)-2-methylpyrimidine (B3PYMPM), and mixtures thereof.

When doped, the second electron-transporting layer may comprise at most 20% of an n-type dopant.

When doped, the second electron-transporting, layer may, for instance, comprise at most 20% of a material selected from the list consisting of 2-(2-Methoxyphenyl)-1,3-dimethyl-1H-benzoimidazol-3-ium iodide (o-MeO-DMBI-I), 1,3-Dimethyl-2-phenyl-2,3-dihydro-1H-benzoimidazole (DMBI), (pentamethylcyclopentadienyl)(1,3,5-trimethylbenzene)ruthenium dimer ([RuCpMes]$_2$), Li, Li$_2$O, 8-Quinolinolato lithium (LiQ), LiF, Li$_3$N, NaF, Ba, Rb$_2$CO$_3$, Cs, CsN$_3$, CsF, CsCo$_3$, and mixtures thereof, amongst others.

In some examples, the first and second hole-transporting layers as well as the first and second electron transporting layer have each an organic component.

In some examples, the first and second hole-transporting layers as well as the first and second electron transporting layer are organic layers.

The second electron-transporting layer may, for instance, be deposited by vacuum evaporation or by solution processing.

In embodiments method A may further comprise a photolithographic patterning step performed on the metal oxide layer and directly after the formation thereof.

When method A further comprises the photolithographic patterning step, the second electron-transporting layer may be deposited on the top surface and on sidewalls of the metal oxide layer, and on sidewalls of the first electron-transporting layer In method B, the second hole transporting layer has a first p-doped hole-transporting surface present on the first electron-transporting layer and a second p-doped hole-transporting surface facing away from the first p-doped hole-transporting surface.

In embodiments, method B may further comprise a photolithographic patterning step performed on the second hole transporting layer, directly after forming of the second hole-transporting layer over the first electron-transporting layer, or on the first electron transporting layer, directly before forming of the second hole-transporting layer over the first electron-transporting layer.

When method B further comprises the photolithographic patterning step, the p-doped second hole transporting layer may be provided on the top surface and on sidewalls of the first electron-transporting layer.

In embodiments, the second hole transporting layer has a first p-doped hole-transporting surface present on the first electron-transporting layer and a second p-doped hole-transporting surface facing away from the first p-doped hole-transporting surface, wherein step is performed directly after forming of the second hole-transporting layer over the first electron-transporting layer thereby forming a patterned second hole-transporting layer, and wherein a step e is performed of providing a further p-doped hole transporting layer on the patterned second hole transporting layer.

In embodiments, the further p-doped hole transpiring layer may be made of any p-doped material known in the art for having holes as a majority charge carrier. In some examples, the further hole-transporting layer has an organic component. An example of the further hole-transporting layer is preferably an organic layer.

In embodiments, the further hole-transporting layer may comprise at least 80 wt % of a material selected from the list consisting of the following compounds: 2,2',7,7'-Tetrakis (diphenylamino)-9,9'-spirobifluorene (Sprio-TAD), Tris(4-carbazoyl-9-ylphenyl)amine (TCTA), 14'-Cyclohexyliden-ebis[N,N-bis(4-methylphenyl)benzenamine] (TAPC), N, N-bis (naphthalen-1-yl)-N, N-bis (phenyl) benzidine, (NPB), and N,N'-Di(1-naphthyl)-N,N'-diphenyl-(1,1'-biphenyl)-4,4'-diamine (Alpha-NPD), and mixtures thereof.

The further hole-transporting layer may comprise at most 20% of a p-type dopant.

The further hole-transporting layer may, for instance, comprise at most 20% of a material selected from the list consisting of hexafluorotetracyanonaphthoquinodimethane (F6TCNNQ), 2,3,5,6-Tetrafluoro-7,7,8,8-tetracyanoquinodimethane (F4TCNQ), MoO$_3$, and mixtures thereof, amongst others.

The further hole-transporting layer may, for instance, be deposited by vacuum evaporation or by solution processing.

In method C, a photolithographic patterning step may be performed during forming of the first electron transporting layer wherein forming of the first electron transporting layer comprises forming of a first part of the first electron transporting layer and forming of a second part of the first electron transporting layer, and wherein the photolithographic patterning step is performed on the layer provided during forming of the first part of the first electron transporting layer. The photolithographic patterning step typically results in the patterning of the layer provided during forming of the first part of the first election transporting layer and of the first hole-transporting layer.

In method C, the step of forming the second part of the first electron transporting layer typically results in the first electron transporting layer being on a top surface and on sidewalls of the first hole-transporting layer.

In embodiments, the photolithographic step may comprise the following steps:
providing a photoresist layer on the layer provided during forming of the first part of the first electron transporting layer;
illuminating pattern-wise the photoresist in such a way as to form a pattern in the photoresist having a different solubility than the rest of the photoresist;
developing the photoresist;
etching at least the layer provided during forming of the first part of the first electron transporting layer by using the developed photoresist as a mask, and
stripping the photoresist.

In embodiments, the photolithographic patterning step may result in the formation of a feature which smallest lateral dimension from 5 μm to 100 nm, e.g. 10 to 50 μm or 15 to 25 μm.

A second aspect relates to a semiconductor device. In embodiments, the semiconductor device is obtainable by any embodiment of the first aspect.

Any feature of the second aspect may be as correspondingly described for the first aspect.

At least one of the layers c and d has an organic component, in some examples, at least one of the first electron-transporting layer and the second hole-transporting layer is an organic layer. In some examples, each of the first electron-transporting layer and the second hole-transporting layer has an organic component. In some examples, both of the first electron-transporting layer and the second hole-transporting layer are organic layers.

The device is further characterized by one of the following features;
Feature A: a metal oxide layer present on the first electron-transporting layer, wherein a second electron-transporting layer is on the metal oxide layer, wherein the second hole-transporting layer is on the second electron-transporting layer, or
Feature B; the second hole transporting layer has a first p-doped hole-transporting surface present on the first, electron-transporting layer and a second p-doped hole-transporting surface facing away from the first p-doped hole-transporting surface, or
Feature C; the first electron-transporting layer is on a top surface and on sidewalls of the first hole-transporting layer.

When feature A is present, in embodiments, the second electron-transporting layer may be on the top surface and on sidewalls of the metal oxide layer, and on sidewalls of the first electron-transporting layer.

When feature B is present, in embodiments, the second hole transporting layer is p-doped and is on a top surface and on sidewalls of the first electron-transporting layer.

Feature C typically results from a photolithographic patterning step as described in method C above.

Comparative Example (referred to as "RE F" in the other figures):

FIG. 5 shows an OLED prepared to illustrate a problem that one or more of the embodiments herein mitigate. The OLED comprises a substrate that comprises a glass underlayer, an indium tin oxide layer thereon, and a patterned SiN layer thereon serving as a pixel definition layer. A 10 nm NPB layer doped by 5% F6TCNNQ which serves as a hole injection layer was deposited under vacuum on a portion of the ITO layer left uncovered by the patterned SiN layer. A 100 nm thick NPB hole transporting layer was deposited under vacuum over the substrate, on the ITO layer. A 20 nm HATCN layer was deposited under vacuum on the hole transporting layer. The thick black, line indicates the location of impurities. In the present example, various devices have been prepared which were either not contaminated or purposefully contaminated by impurities placed on the HATCN electron transporting layer. To contaminate the HATCN layer, the device tinder construction was removed from the vacuum chamber, followed by spin-coating of water or polymer solutions in solvents that did not dissolve the HATCN layer. The device was then heated up to evaporate the water or the solvent. Although the dissolving/evaporation steps leave a device top surface that appears clean, impurities remain as will be evident from the worse J-V curve characteristics measured on the final devices (see below). The devices were then reintroduced in the vacuum chamber where a 30 nm NPB hole transporting layer was provided on the contaminated HATCN layer. A 10 nm NPB layer doped by 5% F6TCNNQ was then formed on the NPB hole transporting layer. Finally, a 150 nm Ag layer was formed on the doped NPB layer. To form the uncontaminated device, the step of removing the device under construction to spin coat a liquid thereon was omitted.

These structures comprised:
A substrate (Glass, ITO, and SiN),
a first hole-transporting layer over the substrate (NPB),
a first electron-transporting layer on the first hole-transporting layer (HATCN), and a second hole-transporting layer over the first electron-transporting layer (NPB).

At least one of the first electron-transporting layer on the first hole-transporting layer and the second hole-transporting layer over the first electron-transporting layer has an organic component (here these layers and the first hole-transporting layer over the substrate are organic layers).

Figure 6:
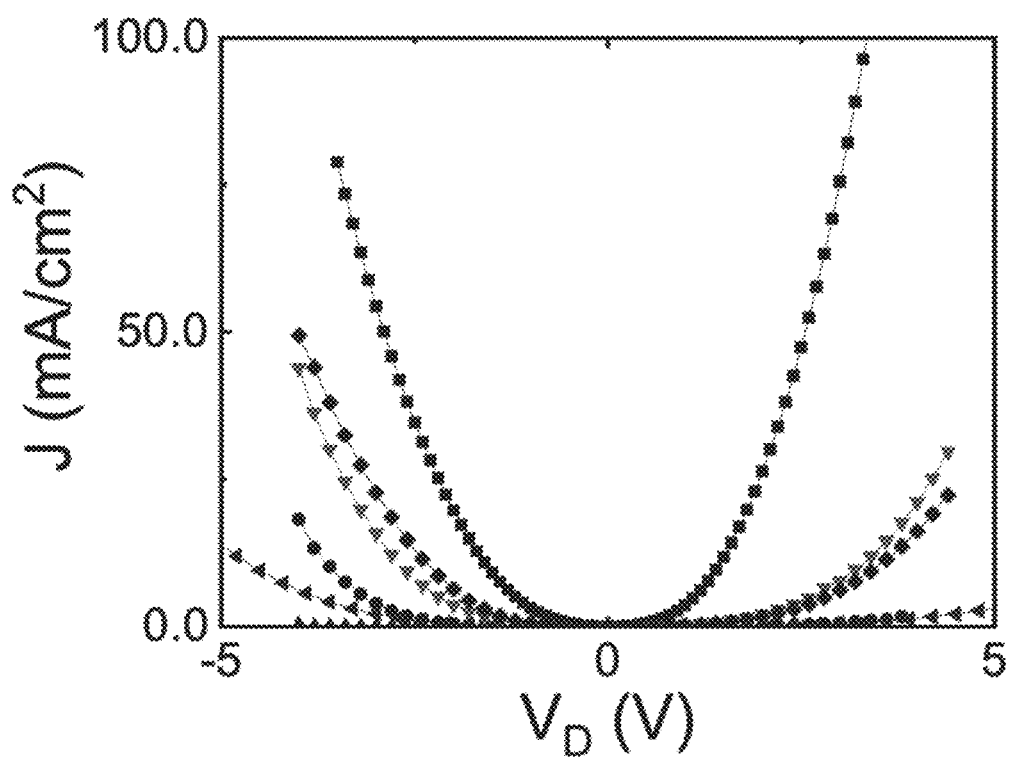
FIGS. 6 and 7 show the J-V characteristics of the device of FIG. 5.
Figure 7:
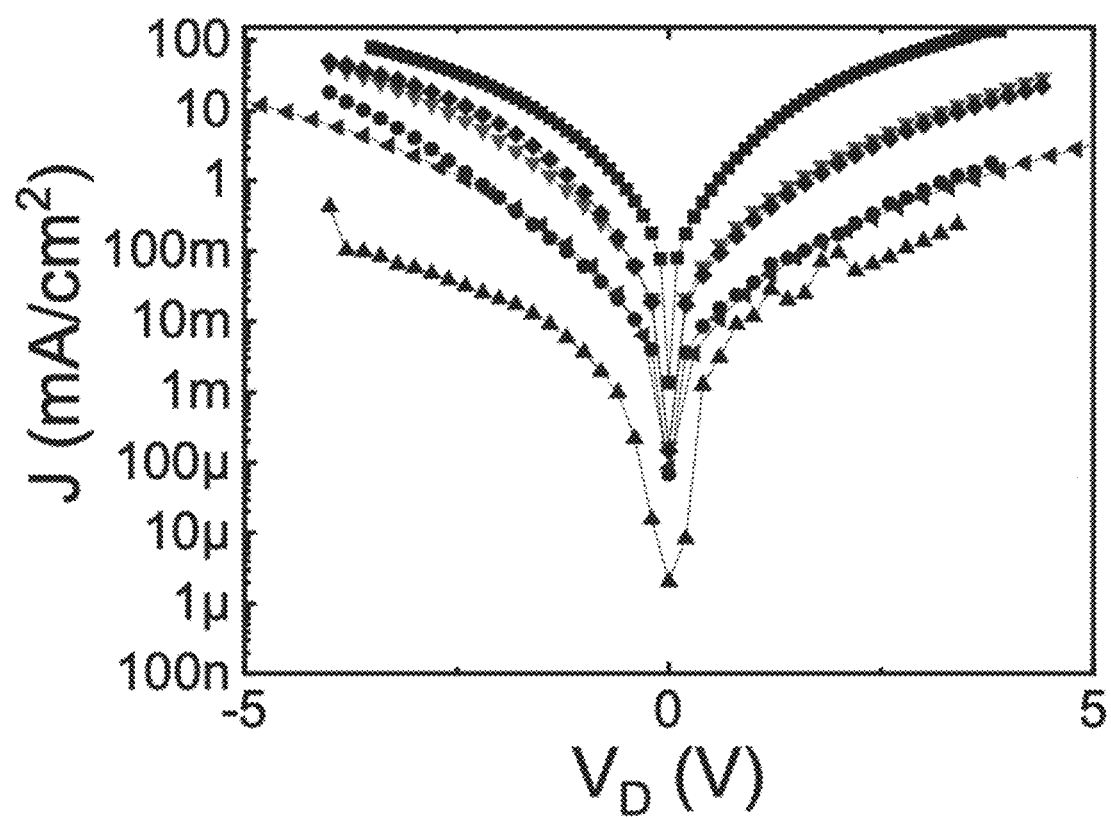

FIGS. 6 and 7 show the current density (J) measured as a function of the applied voltage ($V_D$) between the ITO anode and the Ag cathode for different contaminants and for a contamination-free reference device (squares, referred to as "REF" in the other figures). The contaminants were as follow: water (circles), polyvinylpyrrolidone (triangles pointing up), polyvinylalcohol (triangles pointing down), poly(3,4-ethylenedioxythiophene) (diamonds), and Hyflon®) (triangles pointing left). As can be seen, all contaminants induce an excess voltage in the J-V curves. This excess voltage is typically larger than 6V. The deterioration of the 1-V characteristics is worse at positive voltages than at negative voltages.

At positive voltages, the direction of the current means that the trap states introduced by the contaminants are present at the charge generation interface. Since the trap states are trapping the charge carriers, more voltage is needed for obtaining a same current. At negative voltages, the direction of the current means that the trap states introduced by the contaminants are present at the charge recombination interface. The trap states there act as recombination centers and less deleterious effects are observed.

Example 1

FIG. 8 shows an OLED according to an embodiment. The OLED comprises a substrate that comprises a glass underlayer, an indium tin oxide layer thereon, and a patterned SiN layer thereon. A 10 nm NPB layer doped by 5% F6TCNNQ which serves as a hole injection layer was deposited under vacuum on a SiN-free portion of the ITO layer. A 100 nm thick NPB hole transporting layer was deposited under vacuum over the substrate, on the hole injection layer. A 20 nm HATCN layer was deposited under vacuum on the hole transporting layer. A 10 nm Spiro-TAD:F6TCNNQ hole transporting layer doped with 5% F6TCNNQ was then deposited under vacuum on the HATCN layer. The thick black line indicates the location of impurities. In the present example, the same impurities as for the comparative example have been purposefully placed on the Spiro-TAD hole transporting layer doped with 5% F6TCNNQ by the same procedure as described in the comparative example. After the device had been reintroduced in the vacuum chamber, a second 10 nm Spiro-TAD hole transporting layer doped with 5% F6TCNNQ was deposited under vacuum on the contaminated first Spiro-TAD hole transporting layer doped with 5% F6TCNNQ. A 30 nm NPB hole transporting layer was then deposited under vacuum on the Spiro-TAD:F6TCNNQ hole transporting layer doped with 5% F6TCNNQ A 10 nm NPB layer doped by 5% F6TCNNQ was then deposited on the NPB hole transporting layer. Finally, a 150 nm A layer was deposited under vacuum on the 10 nm NPB layer doped by 5% F6TCNNQ.

In other words, this structure comprises:
a substrate (Glass, ITO, and SiN),
a first hole-transporting layer over the substrate (NPB)
a first electron-transporting layer on the first hole-transporting layer (HATCN), and
a second hole-transporting layer over the first electron-transporting layer (10 nm Doped Spiro-TAT):F6TCNNQ 5%).

At least one of the first electron-transporting layer on the first hole-transporting layer and the second hole-transporting layer over the first electron-transporting layer has an organic component (here these and the first hole-transporting layer over the substrate are organic layers, but it does not have to be so).

In this embodiment, the second hole transporting layer (10 nm doped Spiro-TAD:F6TCNNQ 5%) has a first p-doped hole-transporting surface present on the first electron-transporting layer and a second p-doped hole-transporting surface facing away from the first p-doped hole-transporting surface (since this whole layer is doped and is on the first electron-transporting layer). Contaminants are present on the second hole transporting layer and are in contact with the second p-doped hole-transporting surface. A further (optional) Spiro-TAD layer doped with 5% F6TCNNQ is on the contaminated second hole transporting layer. In this embodiment, contaminants are sandwiched between two p-doped hole transporting layers.

Figure 9:
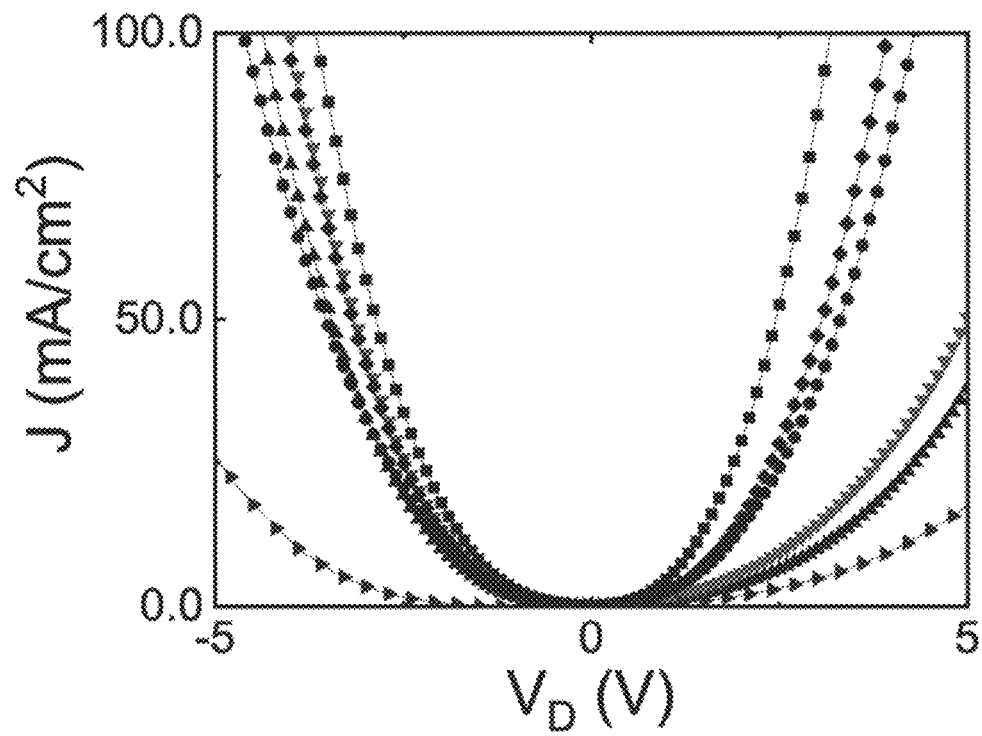
FIGS. 9 and 10 show the J-V characteristics of the device of FIG. 8, in accordance with example embodiments.
Figure 10:
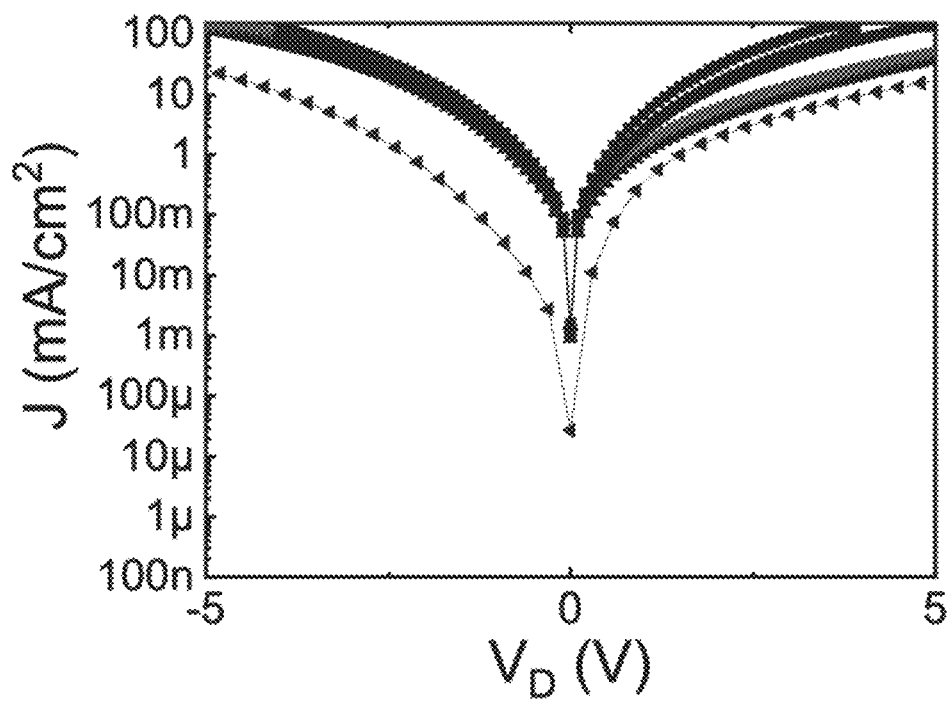
Figure 11:
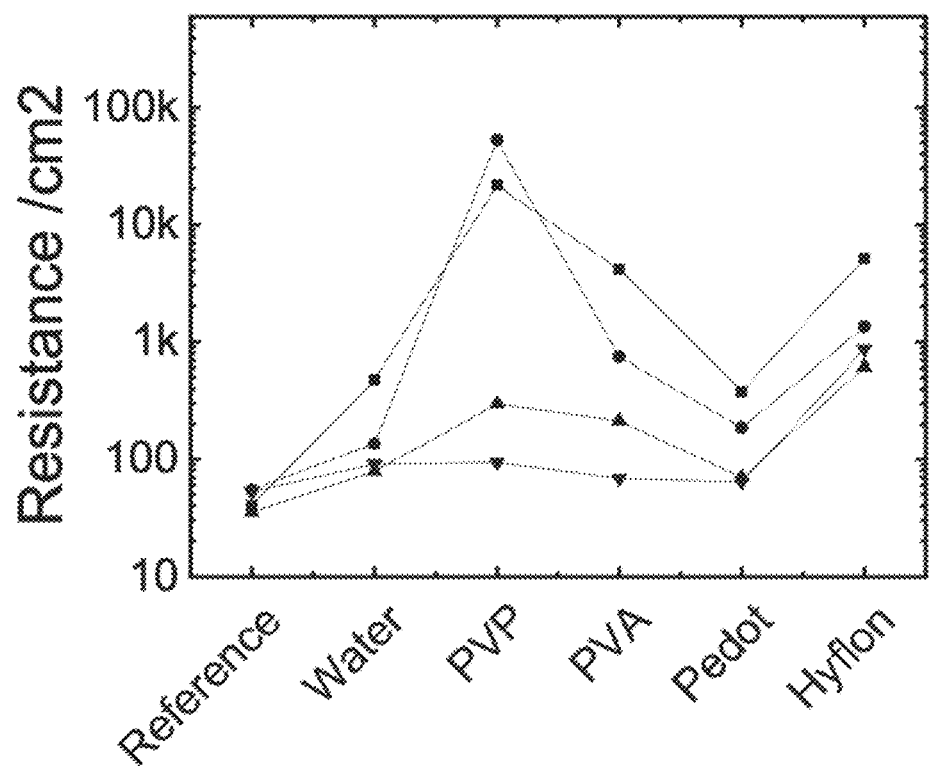
FIG. 11 shows for a fixed voltage of 3 V, the resistance observed for a comparative device and for a device, in accordance with example embodiments.

FIGS. 9 and 10 show the $J/V_D$ curves for the same impurities as in the comparative example. As can be readily observed, the excess voltage drop is significantly smaller in the case of this embodiment (typically less than 6V).

FIG. 1 shows that at a fixed voltage of 3 V, the device of example 1 (device with contaminants embedded by doped hole transporting layers) shows much smaller resistance increase compared to device A (device with contaminants according to the prior art) for all contaminants. The squares show the resistance at 3V in device A, the rounds show the resistance at –3V in device A, the triangles pointing up show the resistance at 3V in device B, and the triangles pointing down show the resistance at –3V in device B.

Example 2

Figure 12:
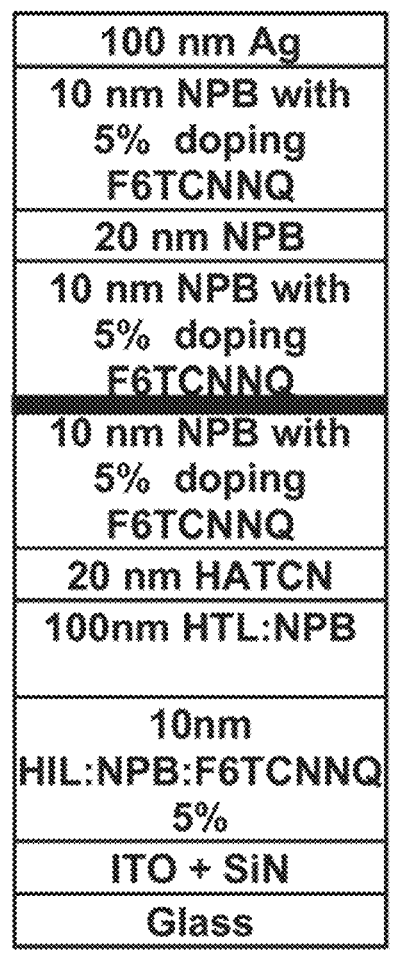
FIG. 12 is a schematical representation of a cross-section of a, in accordance with example embodiments.

We now refer to FIG. 12.

Example 1 was repeated except that a 10 nm NPB doped with 5% F6TCNNQ replaced the 10 nm Spiro-TAD doped with 5% F6TCNNQ for the second and further p-doped hole transporting layer, that the NPB layer over the further p-doped hole transporting layer was 20 nm thick and that the Ag electrode was 100 nm thick.

In other words, this structure comprises:
a substrate (Glass, ITO and SiN),
a first hole-transporting layer over the substrate (NPB),
a first electron-transporting layer on the first hole-transporting layer (HATCN), and
a second hole-transporting layer over the first electron-transporting layer (10 nm NPB doped with 5% F6TCNNQ).

At least one of the first electron-transporting layer on the first hole-transporting layer and the second hole-transporting layer over the first electron-transporting layer has an organic component (here these layers and the first hole-transporting layer over the substrate are organic layers, but it does not have to be so).

In this embodiment, the second hole transporting layer (10 nm NPB with 5% doping F6TCNNQ) has a first p-doped hole-transporting surface present on the first electron-transporting layer and a second p-doped hole-transporting surface facing away from the first p-doped hole-transporting surface (since this whole layer is doped aid Is on the first electron-transporting layer). Contaminants are present on the second hole transporting layer and are in contact with the second p-doped hole-transporting surface. A further (optional) NPB layer doped with 5% F6TCNNQ is on the contaminated second hole transporting layer. In this embodiment, like in example 1, contaminants are sandwiched between two p-doped hole transporting layers.

Figure 13:
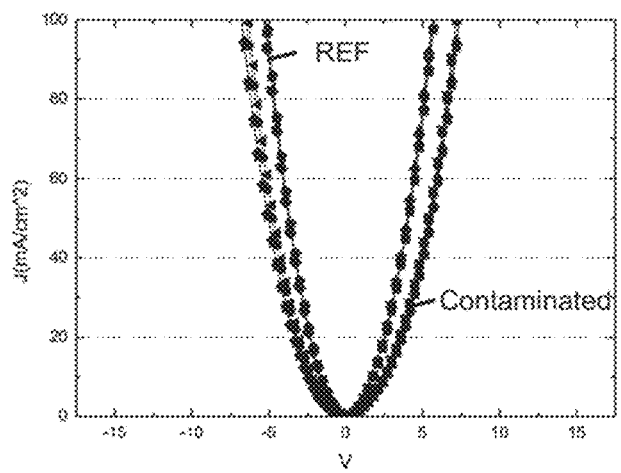
FIG. 13 shows the J-V characteristics of the device of FIG. 12, in accordance with example embodiments.

FIG. 13 shows the $J/V_D$ curve with and without impurities. As can be readily observed, the excess voltage drop is significantly smaller in the case of this embodiment of the present disclosure than in the case of the comparative example (typically less than 6V vs typically more than 6V).

Example 3

Figure 14:
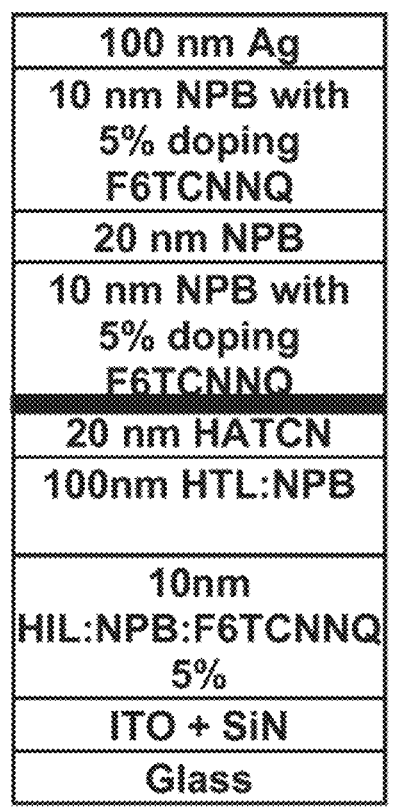
FIG. 14 is a schematical representation of a cross-section of a device, in accordance with example embodiments.

We now refer to FIG. 14.

Example 2 was repeated except that the contaminant layer was formed on the HATCN and that the second hole transporting layer was formed on the contaminated HATCN layer and that no further doped hole transporting layer was formed on the first doped hole transporting layer.

In other words, this structure comprises:
a substrate (Glass, ITO and SiN),
a first hole-transporting layer over the substrate (NPB),
a first electron-transporting layer on the first hole-transporting layer (HATCN), and
a second hole-transporting layer over the first electron-transporting layer (10 nm NPB doped with 5% F6TCNNQ).

At least one of the first electron-transporting layer on the first hole-transporting layer and the second hole-transporting layer over the first electron-transporting layer has an organic component (here these layers and the first hole-transporting layer over the substrate are organic layers, but it does not have to be so).

In this embodiment, the second hole transporting layer (10 nm NPB with 5% doping F6TCNNQ) has a first p-doped hole-transporting surface present on the first electron-transporting layer and a second p-doped hole-transporting surface facing away from the first p-doped hole-transporting surface (since this whole layer is doped and is on the first electron-transporting layer). Contaminants are present on the first electron transporting layer and are in contact with the first p-doped hole-transporting surface. In this embodiment, unlike in examples 1 and 2, contaminants are not sandwiched between two p-doped hole transporting layers but are simply contacted by a single p-doped hole transporting layer.

Figure 15:
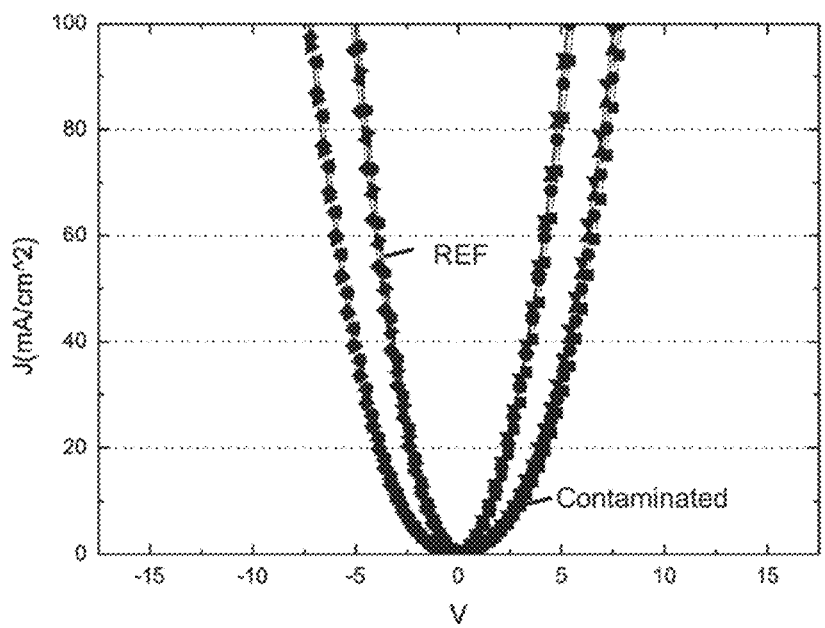
FIG. 15 shows the J-V characteristics of the device of FIG. 14, in accordance with example embodiments.

FIG. 15 shows the Lin-Lin $J/V_D$ curve with and without impurities. As can be readily observed, the excess voltage drop is significantly smaller (typically <6V) in the case of this embodiment of the present disclosure than in the case of the comparative example (typically >6v) but not as small as in the case of example 2.

Example 4

Figure 16:
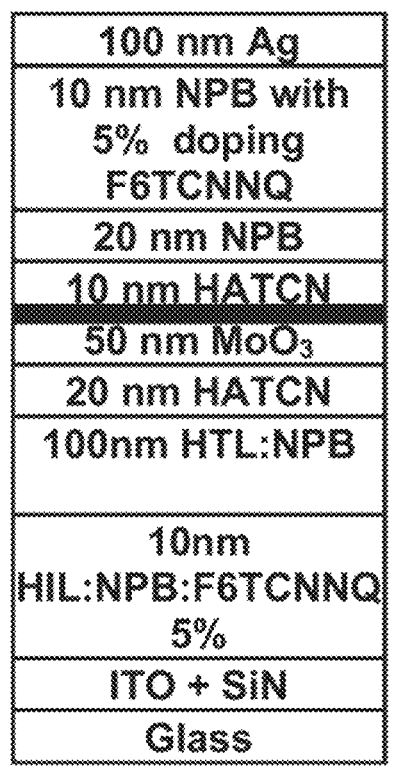
FIG. 16 is a schematical representation of a cross-section of a device, in accordance with example embodiments.
Figure 17:
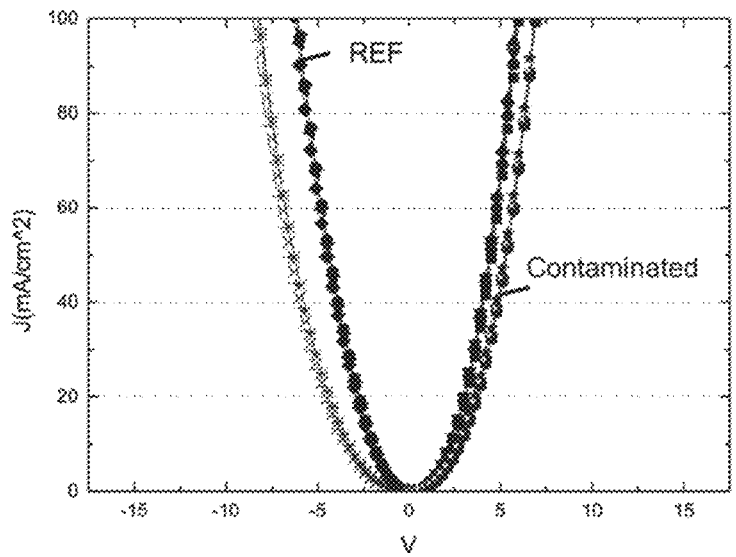
FIG. 17 shows the J-V characteristics of the device of FIG. 16, in accordance with example embodiments.

We now refer to FIG. 16.

Example 3 was repeated except that a 20 nm MoO3 layer was deposited on the HAYCN layer, that the contaminant was deposited on that MoO₃ layer, and that a second electron transporting layer (10 nm HATCN) was deposited on the contaminated MoO₃ layer.

In other words, this structure comprises:
a substrate (Glass, ITO, and SiN),
a first hole-transporting layer over the substrate (NPB),
a first electron-transporting layer on the first hole-transporting layer (HATCN), and
a second hole-transporting layer over the first electron-transporting layer (20 nm NPB).

At least one of the first electron-transporting, layer on the first hole-transporting layer and the second hole-transporting layer over the first electron-transporting layer has an organic component (here these layers and the first hole-transporting layer over the substrate are organic layers, but it does not have to be so).

In this embodiment, method A is followed, i.e., a metal oxide layer (MoO₃) is formed on the first electron-transporting layer and a second electron-transporting layer (10 am HATCN) is formed on the metal oxide layer, wherein the second hole-transporting layer (20 Tim NPB) is on the second electron-transporting layer FIG. 16 shows the Lin-Lin $J/V_D$ curve with and without impurities. As can be readily observed, the excess voltage drop is significantly smaller (typically less than 6V) in the case of this embodiment than in the case of the comparative example. Although the voltage drop improvement is not the same at positive and negative voltages, this embodiment can be used for devices having different driving polarities.

Example 5

Figures 18A, 18B, 19:
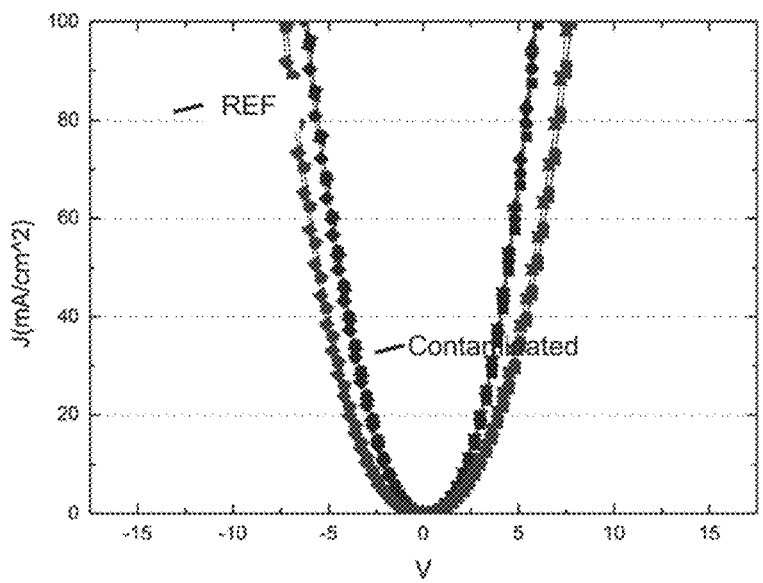
FIGS. 18A and 18B are schematical representations of cross-sections of different devices, in accordance with example embodiments.
FIG. 19 shows the J-V characteristics of the device of FIG. 18A, in accordance with example embodiments.

We now refer to FIG. 18A.

Example 4 was repeated except that the 20 nm MoO3 layer was omitted, that the contaminant was deposited on the first electron transporting layer, and that the second electron transporting layer (10 nm HATCN) was deposited on the contaminated first electron transporting layer.

In other words, this structure comprises:
a substrate (Glass, ITO, and SiN),
a first hole-transporting layer over the substrate (NPB),
a first electron-transporting layer on the first hole-transporting layer (HATCN), and
a second hole-transporting layer over the first electron-transporting layer (20 nm NPB).

At least one of the first electron-transporting layer on the first hole-transporting layer and the second hole-transporting layer over the first electron-transporting layer has an organic component (here these layers and the first hole-transporting layer over the substrate are organic layers, but it does not have to be so).

In this embodiment, a model for method C is performed. Although this method is efficient for reducing the impact of the contaminants on the excess voltage drop, the fact that the contaminants are sandwiched between two electron-transporting layers is not easily detectable by reverse engineering of the device. However, if the contaminant would be introduced due to a photolithographic step (see FIG. 18B), the fact that the first electron-transporting layer would appear to be on a top surface and on sidewalls of the first hole-transporting layer would serve as a signature that method C has been used.

FIG. 19 shows the Lin-Lin $J/V_D$ curve with and without impurities for the device of FIG. 18A. As can be readily observed, the excess voltage drop is significantly smaller (<6V) in the case of this embodiment than in the case of the comparative example. The improvement is of the same order of magnitude than when one or two p-doped hole transporting layers are used (see FIGS. 8, 12, and 14).

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A semiconductor device comprising:
   a substrate;
   a first hole-transporting layer over the substrate;
   a first electron-transporting layer directly on the first hole-transporting layer; and
   a second hole-transporting layer over the first electron-transporting layer,
   wherein at least one of the first electron-transporting layer and the second hole-transporting layer has an organic component,
   wherein:
   a metal oxide layer is directly on the first electron-transporting layer, a second electron-transporting layer is directly on the metal oxide layer, and the second hole-transporting layer is on the second electron-transporting layer.

2. The semiconductor device according to claim 1, wherein the second hole-transporting layer is p-doped and is directly on a top surface and directly on sidewalls of the first electron-transporting layer.

3. The semiconductor device according to claim 1, wherein the metal oxide layer is directly on a top surface of the first electron-transporting layer, wherein the second electron-transporting layer is directly on a top surface and directly on sidewalls of the metal oxide layer and directly on sidewalls of the first electron-transporting layer.

4. The semiconductor device according to claim 1, wherein the second hole-transporting layer is p-doped and is on a top surface and on sidewalls of the first electron-transporting layer.

5. The semiconductor device according to claim 1, wherein the metal oxide layer is on a top surface of the first electron-transporting layer, wherein the second electron-transporting layer is on a top surface and on sidewalls of the metal oxide layer and on sidewalls of the first electron-transporting layer.

6. A semiconductor device comprising:
   a substrate;
   a first hole-transporting layer over the substrate;
   a first electron-transporting layer directly on the first hole-transporting layer; and
   a second hole-transporting layer over a second electron-transporting layer,
   wherein at least one of the first electron-transporting layer and the second hole-transporting layer has an organic component,
   wherein:
   the second hole-transporting layer has a first p-doped hole-transporting surface directly on the first electron-transporting layer and a second p-doped hole-transporting surface facing away from the first p-doped hole-transporting surface, or
   the first electron-transporting layer is directly on a top surface of the first hole-transporting layer and the second electron-transporting layer is directly on sidewalls of the first hole-transporting layer.

7. The semiconductor device according to claim 6, wherein the second hole-transporting layer is p-doped and is on a top surface and on sidewalls of the first electron-transporting layer.

8. The semiconductor device according to claim 6, wherein the metal oxide layer is on a top surface of the first electron-transporting layer, wherein the second electron-transporting layer is on a top surface and on sidewalls of the metal oxide layer and on sidewalls of the first electron-transporting layer.

* * * * *